United States Patent [19]

Watanabe

[11] Patent Number: 5,157,626

[45] Date of Patent: Oct. 20, 1992

[54] SEMICONDUCTOR MEMORY

[75] Inventor: Takeshi Watanabe, Tokyo, Japan

[73] Assignee: NEC Corporation, Tokyo, Japan

[21] Appl. No.: 616,957

[22] Filed: Nov. 21, 1990

[30] Foreign Application Priority Data

Nov. 21, 1989 [JP] Japan ................................. 1-304046

[51] Int. Cl.$^5$ .............................................. G11C 13/00
[52] U.S. Cl. .................................... 365/185; 365/210
[58] Field of Search ..................... 365/185, 189.01, 210

[56] References Cited

U.S. PATENT DOCUMENTS 5,081,610 1/1992 Olivo et al. ......................... 365/185

Primary Examiner—Terrell W. Fears
Attorney, Agent, or Firm—Sughrue, Mion, Zinn, Macpeak & Seas

[57] ABSTRACT

A semiconductor memory comprises a reading circuit including a memory cell composed of a selection transistor and a memory transistor having a floating gate, a reading reference circuit having a dummy memory cell having the same construction as that of the memory cell, and a comparator for receiving and comparing an output of the memory cell of the reading circuit and an output of the dummy memory cell of the reading reference circuit. A voltage supply circuit applies a predetermined voltage to a control gate of a dummy memory transistor of the dummy memory cell so as to cause a drain current to flow through the dummy memory transistor. The output of the memory cell in a written condition is compared with the output of the dummy memory cell, and when the output of the memory cell in a written condition is consistent with the output of the dummy memory cell, a threshold voltage of the memory transistor in the written condition is estimated on the basis of the predetermined voltage applied to the control gate of the dummy memory transistor.

5 Claims, 3 Drawing Sheets

SEMICONDUCTOR MEMORY

BACKGROUND OF THE INVENTION

1. Field of the Invention

The present invention relates to a semiconductor memory, and more specifically to a non-volatile semiconductor memory comprising a plurality of memory cells each of which includes a memory transistor having a floating gate, so that each memory cell can be electrically written and electrically erased.

2. Description of Related Art

Conventionally, writing of data into this type of semiconductor memory has been performed by applying a high voltage between a control gate and a drain of a selected memory transistor, so that carriers in the form of a hole are injected into a floating gate of the selected memory transistor. A time required for completing the injection of the carriers into the floating gate is determined by a device structure including a thickness of gate insulator and others. In addition, as a means for reading a writing characteristics in which a threshold voltage will be brought into a negative due to movement of the carriers, there has been known a circuit for applying a negative potential to the control gate of the memory transistor.

In the above mentioned semiconductor memory, on the other hand, a plurality of memory cells have been arranged in the form of a matrix, and therefore, there has been provided a logic circuit for selecting one memory cell by applying an output of the logic circuit to a control gate of the memory transistor of the selected memory cell. However, since the control gate is electrically connected to a diffused region, it has been impossible to apply a negative potential to the control gate. For this reason, there has been no means for verifying a threshold voltage after written. Therefore, it is not possible to verify a data writing characteristics.

As mentioned above, since the conventional semiconductor memory cannot apply a negative voltage to the control gate, it is not possible to measure a threshold voltage after written. Because of this, the writing has been performed with a large margin. Namely, a writing time has been wastefully consumed. Therefore, the conventional semiconductor memory has a disadvantage in that a voluminous writing time has been required.

In addition, since it is not possible to directly measure the writing characteristics, a quality guarantee cannot be given on a change in time of the threshold voltage after written.

SUMMARY OF THE INVENTION

Accordingly, it is an object of the present invention to provide a semiconductor memory which has overcome the above mentioned defect of the conventional one.

Another object of the present invention is to provide a semiconductor memory which can be written with a reduce time and which can give a guarantee of quality after written.

The above and other objects of the present invention are achieved in accordance with the present invention by a semiconductor memory comprising a reading circuit including a memory cell composed of a selection transistor and a memory transistor having a floating gate, a reading reference circuit having a dummy memory cell having the same construction as that of the memory cell, a comparator for receiving and comparing an output of the memory cell of the reading circuit and an output of the dummy memory cell, and a voltage supply circuit for applying a predetermined voltage to a control gate of a dummy memory transistor of the dummy memory cell so as to cause a drain current to flow through the dummy memory transistor, whereby the output of the memory cell in a written condition is compared with the output of the dummy memory cell by the comparator, and when the output of the memory cell in a written condition is consistent with the output of the dummy memory cell, a threshold voltage of the memory transistor in the written condition is estimated on the basis of the predetermined voltage applied to the control gate of the dummy memory transistor.

In one embodiment of the semiconductor memory, the voltage supply circuit includes a load means connected between a high voltage and the control gate of the memory transistor of the dummy memory cell, and a plurality of series-connected diodes connected in a forward direction between the control gate of the memory transistor of the dummy memory cell and a low voltage, and a short-circuiting circuit for selectively short-circuiting at least one of the diodes.

Preferably, each of the diodes is formed of a MOS transistor connected in the form of a diode in which a drain and a gate are commonly connected to each other, and the short-circuiting circuit operates to short-circuit the drain and a source of the MOS transistor connected in the form of the diode. In addition, the short-circuiting circuit includes a control MOS transistor having a drain and a source respectively connected to the drain and the source of the MOS transistor connected in the form of the diode, a gate of the control MOS transistor being connected to receive a control signal, so that when the control MOS transistor is turned on in response to the control signal supplied to the gate of the control MOS transistor, the drain of the MOS transistor connected in the form of the diode is short-circuited to a source of the same MOS transistor.

Alternatively, the short-circuiting circuit includes a single control MOS transistor having a drain and a source connected to the control gate of the memory transistor of the dummy memory cell and the low voltage, respectively, a gate of the control MOS transistor being connected to receive a control signal, so that when the control MOS transistor is turned on in response to the control signal supplied to the gate of the control MOS transistor, the control gate of the memory transistor of the dummy memory cell is short-circuited to the low voltage.

The above and other objects, features and advantages of the present invention will be apparent from the following description of preferred embodiments of the invention with reference to the accompanying drawings.

DESCRIPTION OF THE PREFERRED EMBODIMENTS

Figure 1:
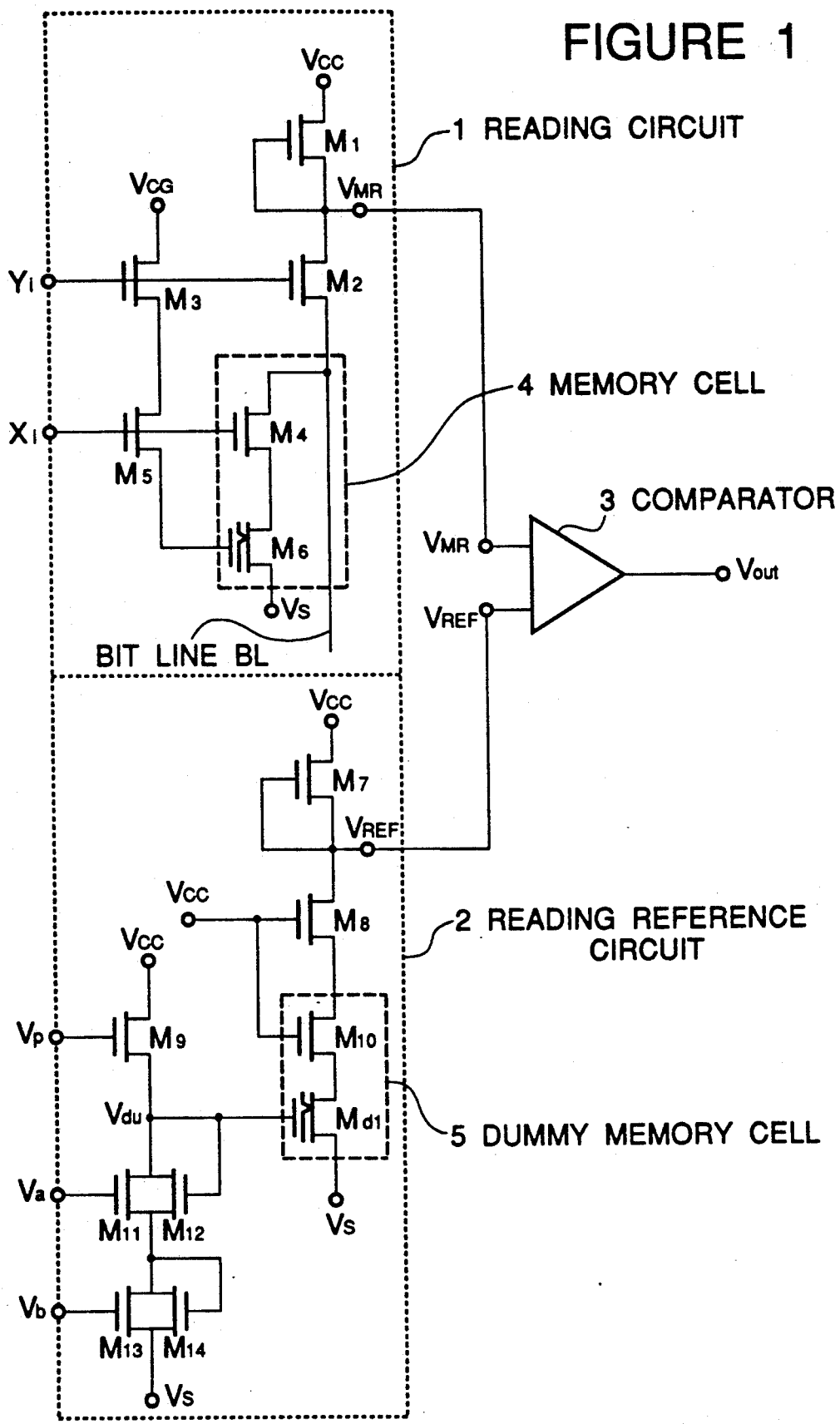
FIG. 1 is a circuit diagram of a first embodiment of the semiconductor memory in accordance with the present invention.

Referring to FIG. 1, there is shown a circuit diagram of a first embodiment of the semiconductor memory in accordance with the present invention.

The shown semiconductor memory includes a reading circuit 1 including a plurality of memory cells 4, a reading reference circuit 2 including a dummy memory cell 5, and a comparator 3 receiving an output $V_{MR}$ of the reading circuit 1 and an output $V_{REF}$ of the reading reference circuit 2 for comparing the output $V_{MR}$ with the output $V_{REF}$. For simplification of the drawing, only one memory cell included in the reading circuit 1 is shown in the drawing.

Each memory cell 4 of the reading circuit 1 is composed of a selection transistor $M_4$ of an N-channel type and a memory transistor $M_6$ having a floating gate. The selection transistor $M_4$ has a drain connected to a bit line BL or a column selection line, and has a gate driven by an output Xi of an X-decoder (not shown). Actually, a number of memory cells are connected to one bit line, however, only one memory cell connected to one bit line is shown in the drawing for simplification of the drawing.

The memory transistor $M_6$ is connected at its one end to a source of the selection transistor $M_4$ and at its other end to a low voltage $V_S$. In addition to the memory cell 4, the reading circuit 1 includes a P-channel MOS transistor $M_1$ connected in the form of a load so as to have a source to a high voltage $V_{CC}$ and a drain connected to a gate of the MOS transistor $M_1$ itself, and a Y-selection transistor $M_2$ of an N-channel type having a drain connected to the drain of the load MOS transistor $M_1$ and a source connected to the bit line BL. The Y-selection transistor $M_2$ has a gate driven by an output Yi of a Y-decoder (not shown).

The reading circuit also includes another Y-selection transistor $M_3$ of an N-channel type having a drain connected to a control gate voltage $V_{CG}$ and a gate driven by the output Yi of the Y-decoder, and an X-selection transistor $M_5$ of an N-channel type having a gate connected to the output Xi of the X-decoder, and connected at its drain to a source of the Y-selection transistor $M_3$ and at its source to a control gate of the memory transistor $M_6$.

On the other hand, the dummy memory cell 5 of the reading reference circuit 2 is composed of transistors $M_{10}$ and $M_{d1}$ which have the same structure as those of corresponding ones of the memory cell 4, respectively. In addition, the reading reference circuit 2 also includes a P-channel transistor $M_7$ connected in the form of a load having a source connected to the high voltage $V_{CC}$ and a gate connected to a drain of the transistor $M_7$ itself, and a selection transistor $M_8$ of an N-channel type having a drain connected to the drain of a load transistor $M_7$ and a source connected to a drain of the selection transistor $M_{10}$ of the dummy memory cell 5. A gate of each of the transistors $M_8$ and $M_{10}$ is connected to the high voltage $V_{CC}$.

A control gate $V_{du}$ of the memory transistor $M_{d1}$ of the dummy memory cell 5 is connected to one end of a series circuit composed of two series-connected diodes, which are respectively formed of N-channel transistors $M_{12}$ and $M_{14}$, having a drain and a gate commonly connected to each other. The other end of the series circuit, namely, a source of the transistor $M_{14}$ is connected to the low voltage $V_S$. In order to short-circuit the drain (i.e., drain/gate) and a source of each of the transistors $M_{12}$ and $M_{14}$ connected in the form of a diode, each of a pair of N-channel transistors $M_{11}$ and $M_{13}$ is connected in parallel in a corresponding one of the transistors $M_{12}$ and $M_{14}$. Namely, a drain and a source of the transistor $M_{11}$ are connected to the drain and the source of the transistor $M_{12}$, respectively, and a drain and a source of the transistor $M_{13}$ are connected to the drain and the source of the transistor $M_{14}$, respectively. Gates of the transistors $M_{11}$ and $M_{13}$ are connected to voltage signals Va and Vb, respectively. In addition, the control gate of $V_{du}$ of the memory transistor $M_{d1}$ of the dummy memory cell 5 is connected to the high voltage $V_{CC}$ through a load P-channel transistor $M_9$ which has a gate connected to a voltage signal Vp.

Now, a structure and a characteristics of the above mentioned memory transistor $M_6$ and $M_{d1}$ will be explained with reference to FIGS. 2 and 3.

Figure 2:
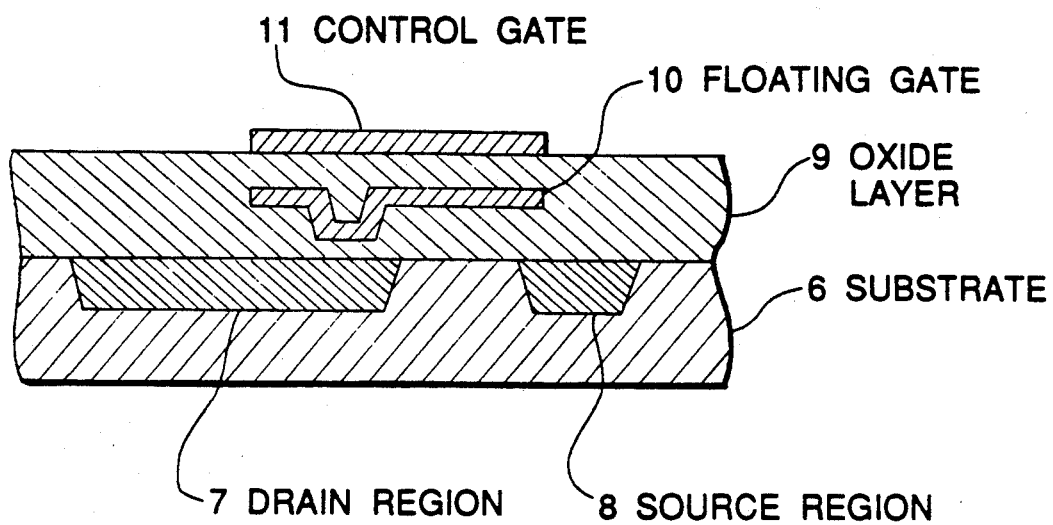
FIG. 2 is a diagrammatic sectional view of a memory transistor used in the semiconductor memory shown in FIG. 1.
Figure 3:
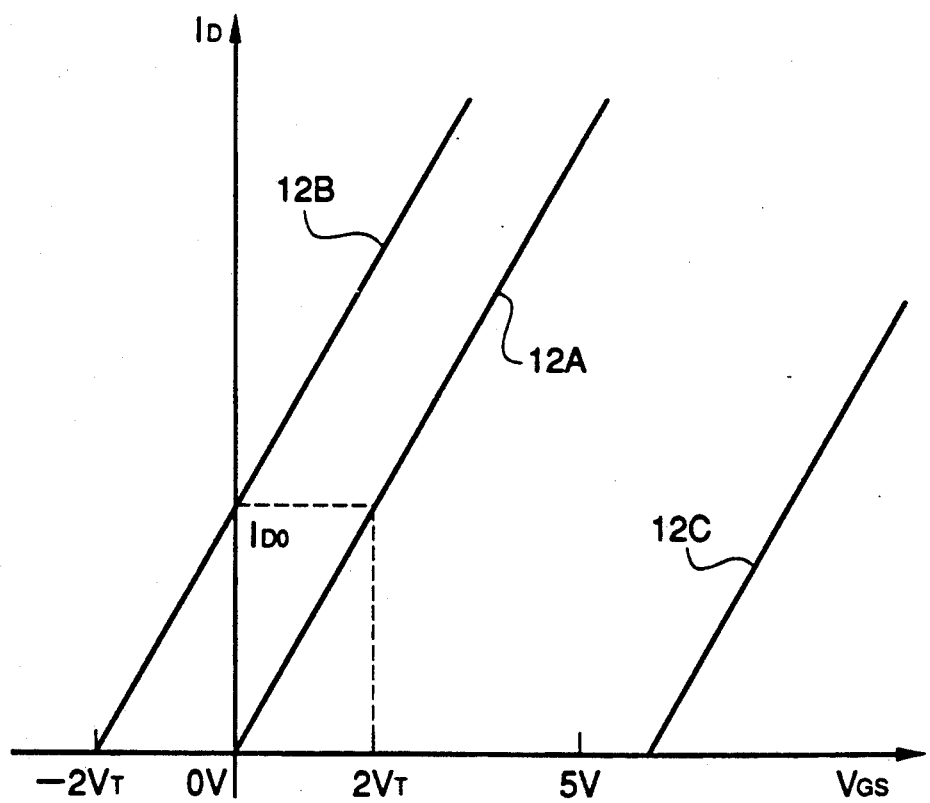
FIG. 3 is a graph illustrating a relation between a gate-source voltage and a drain current in the memory transistor used in the semiconductor memory shown in FIG. 1.

Referring to FIG. 2, there is shown a diagrammatic sectional view of each of the memory transistors shown in FIG. 1, and also referring to FIG. 3, there is shown a graph illustrating a relation between a gate-source voltage and a drain current in the memory transistor shown in FIG. 1.

As shown in FIG. 2, the memory transistor includes an N-type drain region 7 and an N-type source region 8 formed in a P-type silicon substrate 6. A silicon oxide layer 9 is formed on a surface of the silicon substrate 6 to cover the substrate 6 and the regions 7 and 8 formed in the substrate 6. Within the oxide layer 9, a floating gate 10 is buried to cover a portion of the drain region 7, a portion of the source region 8 and a substrate region between the drain region and the source region 8. A portion of the floating gate 10 very approaches to the drain region 7, as seen from FIG. 2. A control gate 11 is formed on the silicon oxide layer 9 so as to overlap the floating gate 10.

In the memory transistor having the above mentioned structure, when data is written, a Vpp voltage (+21 V) is applied to the drain region 7, and a voltage of 0 (zero) V is applied to the control gate 11. As a result, an intense electric field from the drain region 7 to the control gate 11 is generated, so that electrons in the floating gate 10 is discharged to the drain region 7 through a very thin oxide layer between the drain region 7 and the floating gate 10 (a tunnel oxide layer=not greater than 100 Å). Accordingly, holes are accumulated in the floating gate 10. Namely, the floating gate 10 is charged with positive electricity, and an inversion layer connecting the drain region 7 and the source region 8 is formed in the substrate 6. In this condition, even if the control gate voltage of 0 V and the drain voltage Vpp are removed, the floating gate 10 is maintained in a positively charged condition, and therefore, the inversion layer will not disappear. In other words, after data is written, the memory transistor is converted from an enhancement type to a depletion type.

In addition, as shown in FIG. 3, a characteristics of a control gate/source voltage $V_{GS}$ versus a drain current $I_D$ is shifted from an initial characteristics curve 12A to a post-write characteristics curve 12B in which a drain current $I_D$ elevates by $I_{DO}$. Namely, since the memory transistor becomes the depletion type, the drain current ID will flow even at the control gate/source voltage $V_{GS}$ of 0 V. On the other hand, the control gate/source voltage $V_{GS}$ bringing the drain current $I_D$ to 0 V, namely the threshold voltage of the written memory transistor becomes about $-2\,V_T\,(V_T \approx 1\,V)$.

The above is the data writing. Next, data erasing will be described.

When data is erased in the memory transistor shown in FIG. 2, a voltage of the Vpp level is applied to the control gate 11, and a voltage of 0 V is applied to the drain region 7. In this case, As a result, an intense electric field from the control gate 11 to the drain region 7 is generated, so that electrons are injected into the floating gate 10. Accordingly, the inversion layer formed in the substrate 6 will disappear, and the memory transistor is returned to the enhancement type.

In addition, as shown in FIG. 3, the memory transistor returned to the enhancement type as the result of the data erasing, has a characteristics of a control gate/source voltage $V_{GS}$ versus a drain current $I_D$, as shown by a curve 12C. Namely, the drain current $I_D$ will not flow at the control gate/source voltage $V_{GS}$ of 0 V. A threshold voltage $V_{TE}$ of the erased memory transistor becomes about 5 V.

When data is read out, 0 V is applied to the control gate 11 shown in FIG. 2, whether the memory transistor is in a written condition or in an erased condition is determined on the basis of whether or not the drain current $I_D$ flows.

Next, operation shown in FIG. 1 will be explained. The memory transistor $M_6$ of the memory cell 4 in the written condition has a negative threshold voltage. The memory cell 4 is selected at the time of reading by maintaining $V_{CG}$ at 0 V and by applying 5 V to Xi and Yi, respectively. As a result, the memory transistor $M_6$ is turned on. At this time, on the other hand, the memory transistor $M_{d1}$ of the dummy memory cell 5 has the initial characteristics 12A, and therefore maintains the initial threshold voltage of 0 V.

In order to measure the negative threshold of the written memory transistor $M_6$, a current of the dummy memory transistor $M_{d1}$ is compared with a current of the memory transistor $M_6$ while applying a positive voltage to the control gate of the dummy memory transistor $M_{d1}$. The positive voltage applied to the control gate of the dummy memory transistor $M_{d1}$ is supplied from the circuit composed of the transistors $M_9$ and $M_{11}$ to $M_{14}$ by applying the voltage signal Vp to the gate of the load transistor $M_9$ so as to turn on the load transistor $M_9$. For example, if a voltage of $2\,V_T\,(\approx 2\,V)$ is applied to the control gate of the dummy memory transistor $M_{d1}$, the drain current $I_D$ will flow. At this time, if a drain current of the memory transistor $M_6$ is the same as the drain current $I_D$ of the dummy memory transistor $M_{d1}$, namely, if $V_{MR}=V_{REF}$, it can be found that the memory transistor $M_6$ has a threshold voltage of $-2\,V_T$. In this manner, by comparing the current of the dummy memory transistor $M_{d1}$ with the current of the memory transistor $M_6$ while applying a positive volt-voltage to the control gate of the dummy memory transistor $M_{d1}$, namely by comparing $V_{MR}$ with $V_{REF}$, it is possible to measure the threshold voltage of the memory transistor $M_6$ without applying a negative voltage to the control gate of the memory transistor $M_6$.

The voltage Vdu applied to the gate of the dummy memory transistor $M_{d1}$ can be easily changed by controlling the voltage signals Va and Vb. For example, if both of the voltage signals Va and Vb are brought to a low level, the voltage Vdu is brought to $2\,V_T\,(2\,V)$. Here, $V_T$ is a threshold voltage of each of the transistors $M_{12}$ and $M_{14}$. If both of the voltage signals Va and Vb are brought to a high level, the voltage Vdu is brought to 0 V. In addition, if only either of the voltage signals Va and Vb is brought to a high level, the voltage Vdu is brought to $V_T\,(1\,V)$.

The above mentioned embodiment is such that the dummy memory cell 5 is provided and the control gate of the memory transistor $M_{d1}$ of the dummy memory cell is applied with n times a threshold voltage so that the current of the dummy memory cell is compared with the current of the memory cell $M_6$. With this procedure, the threshold voltage of the memory transistor $M_6$ of the memory cell 4 can be measured while maintaining the control gate of the memory transistor $M_6$ at 0 V.

Figure 4:
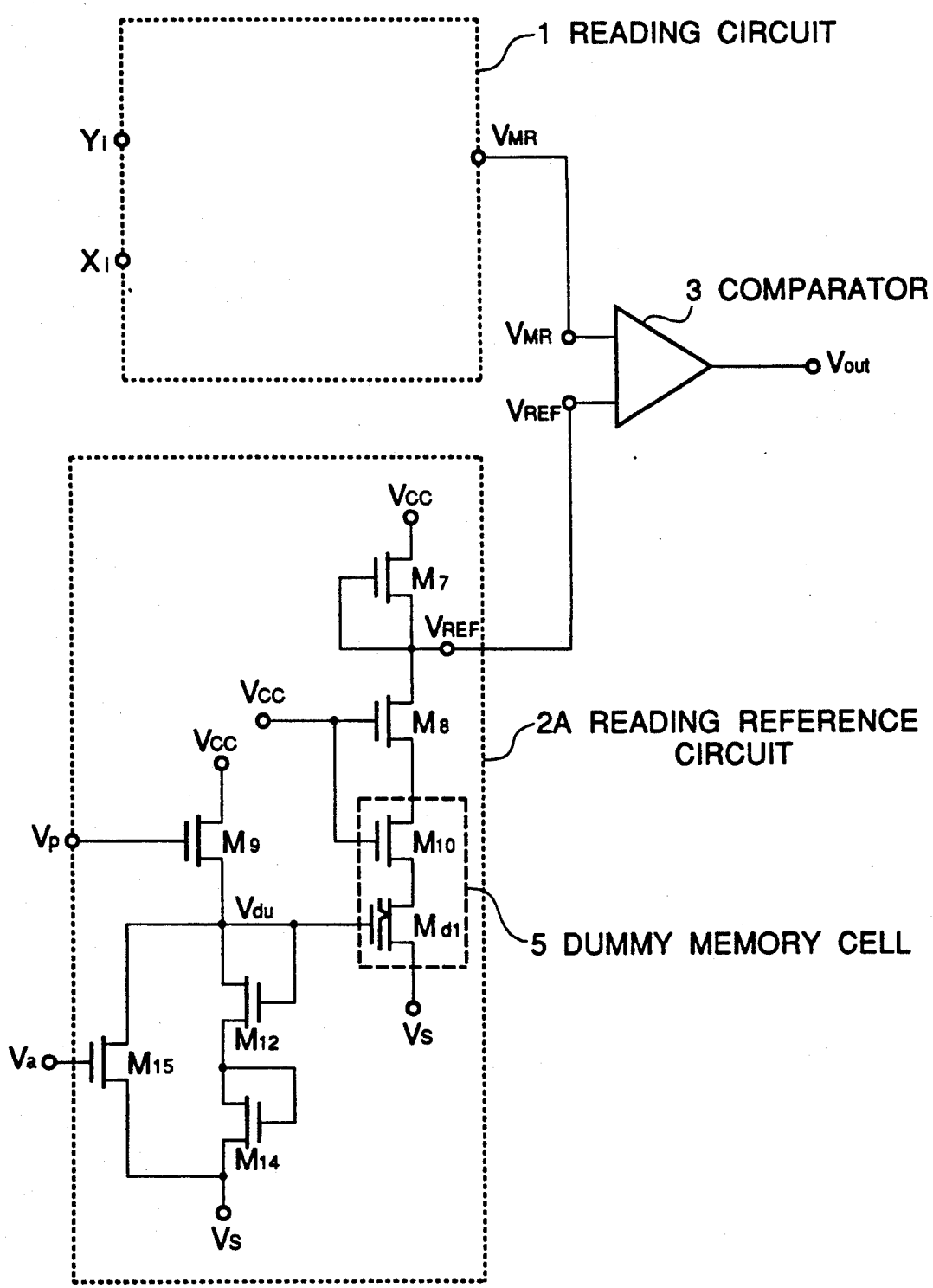
FIG. 4 is a circuit diagram of a second embodiment of the semiconductor memory in accordance with the present invention.

Referring to FIG. 4, there is shown a circuit diagram of a second embodiment of the semiconductor memory in accordance with the present invention. In FIG. 4, elements identical to those shown in FIG. 1 are given the same Reference Numerals, and explanation thereof will be omitted. Particularly, since the reading circuit 1 shown in FIG. 4 is the same as that shown in FIG. 1, the internal circuit of the reading circuit 1 is omitted in FIG. 4.

As seen from comparison between FIGS. 1 and 4, the second embodiment includes a reading reference circuit 2A, in which, in place of the transistors $M_{11}$ and $M_{13}$ provided in the first embodiment, an N-channel transistor $M_{15}$ is connected between the control gate Vdu of the dummy memory cell $M_{d1}$ and the low voltage $V_{SS}$ so as to short-circuit between the control gate $V_{du}$ and the low voltage $V_S$. The second embodiment is advantageous over the first embodiment in which the number of transistors can be reduced in comparison with the first embodiment.

As seen from the above, in the semiconductor memory in accordance with the present invention, it is possible to measure a threshold voltage of a written memory cell by applying a predetermined positive voltage to a dummy memory transistor. This is very advantageous, since it is possible to reduce and optimize the writing time and to give a guarantee of quality after written.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory comprising a reading circuit including a memory cell composed of a selection transistor and a memory transistor having a floating gate, a reading reference circuit having a dummy memory cell having the same construction as that of said memory cell, a comparator for receiving and comparing an output of said memory cell of said reading circuit and an output of said dummy memory cell, and a voltage supply circuit for applying a predetermined voltage to a control gate of a dummy memory transistor of said dummy memory cell so as to cause a drain current to flow through said dummy memory transistor.

whereby said output of said memory cell in a written condition is compared with said output of said dummy memory cell by said comparator, and when said output of said memory cell in a written condition is consistent with said output of said dummy memory cell, a threshold voltage of said memory transistor in the written condition is estimated on the basis of said predetermined voltage applied to said control gate of said dummy memory transistor.

2. A semiconductor memory claimed in claim 1 wherein said voltage supply circuit includes a load connected between a high voltage and said control gate of said memory transistor of said dummy memory cell, and a plurality of series-connected diodes connected between said control gate of said memory transistor of said dummy memory cell and a low voltage, and a short-circuiting circuit for selectively short-circuiting at least one of said diodes.

3. A semiconductor memory claimed in claim 2 wherein each of said diodes is formed of a MOS transistor connected in the form of a diode in which a drain and a gate are commonly connected to each other, and said short-circuiting circuit operates to short-circuit said drain and a source of said MOS transistor connected in the form of the diode.

4. A semiconductor memory claimed in claim 3 wherein said short-circuiting circuit includes a control MOS transistor having a drain and a source connected to said drain and said source of said MOS transistor connected in the form of the diode, respectively, a gate of said control MOS transistor being connected to receive a control signal, so that when said control MOS transistor is turned on in response to said control signal supplied to said gate of said control MOS transistor, said drain and said source of said MOS transistor connected in the form of the diode is short-circuited.

5. A semiconductor memory claimed in claim 3 wherein said short-circuiting circuit includes a single control MOS transistor having a drain and a source connected to said control gate of said memory transistor of said dummy memory cell and said low voltage, respectively, a gate of said control MOS transistor being connected to receive a control signal, so that when said control MOS transistor is turned on in response to said control signal supplied to said gate of said control MOS transistor, said control gate of said memory transistor of said dummy memory cell is short-circuited to said low voltage.

* * * * *